United States Patent
Kim et al.

(10) Patent No.: US 8,749,044 B2
(45) Date of Patent: Jun. 10, 2014

(54) SEMICONDUCTOR MEMORY MODULES AND METHODS OF FABRICATING THE SAME

(71) Applicant: Samsung Electronics Co., Ltd., Suwon-si (KR)

(72) Inventors: Young-Ja Kim, Hwasung (KR); Junyoung Ko, Hwasung (KR); Daesang Chan, Hwasung (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 13/831,272

(22) Filed: Mar. 14, 2013

(65) Prior Publication Data

US 2013/0270696 A1   Oct. 17, 2013

(30) Foreign Application Priority Data

Apr. 12, 2012   (KR) .................. 10-2012-0037734

(51) Int. Cl.
*H01L 23/48*   (2006.01)
(52) U.S. Cl.
USPC ........................................ 257/690; 257/778
(58) Field of Classification Search
USPC .......................................... 257/690, 737, 778
See application file for complete search history.

(56) References Cited

U.S. PATENT DOCUMENTS

| | | | |
|---|---|---|---|
| 6,287,893 B1 | 9/2001 | Elenius et al. | |
| 6,441,487 B2 | 8/2002 | Elenius et al. | |
| 6,750,135 B2 * | 6/2004 | Elenius et al. | ............... 438/615 |
| 6,951,811 B2 | 10/2005 | Sorimachi | |
| 2001/0011764 A1 | 8/2001 | Elenius et al. | |
| 2001/0031548 A1 | 10/2001 | Elenius et al. | |
| 2004/0229446 A1 | 11/2004 | Sorimachi | |
| 2010/0102433 A1 * | 4/2010 | Doan | ............................ 257/690 |
| 2010/0109156 A1 | 5/2010 | Hu et al. | |

FOREIGN PATENT DOCUMENTS

| | | |
|---|---|---|
| JP | 2000-022045 | 1/2000 |
| JP | 3339472 | 8/2002 |
| JP | 2004-063551 | 2/2004 |
| JP | 2004-335915 | 11/2004 |
| JP | 2010-177332 | 8/2010 |
| JP | 4580550 A | 9/2010 |
| KR | 1020040097899 A | 11/2004 |
| KR | 10-0541827 A | 1/2006 |
| KR | 10-0831968 A | 5/2008 |
| KR | 1020090066517 A | 6/2009 |

* cited by examiner

*Primary Examiner* — Roy Potter
(74) *Attorney, Agent, or Firm* — Renaissance IP Law Group LLP

(57) ABSTRACT

The inventive concept provides semiconductor memory modules and methods of fabricating the same. The semiconductor memory module may include a module board having a first surface and a second surface opposite to the first surface, and memory chips mounted directly on the module board by a flip-chip bonding method. Each of the memory chips may include a passivation layer disposed on a rear surface of each of the memory chips, and the passivation layer may have a color different from a natural color of single-crystalline silicon.

14 Claims, 6 Drawing Sheets

SEMICONDUCTOR MEMORY MODULES AND METHODS OF FABRICATING THE SAME

CROSS-REFERENCE TO RELATED APPLICATIONS

This U.S. non-provisional patent application claims priority under 35 U.S.C. §119 to Korean Patent Application No. 10-2012-0037734, filed on Apr. 12, 2012, the entirety of which is incorporated by reference herein.

TECHNICAL FIELD

This disclosure relates to semiconductor memory modules and methods of fabricating the same and, more particularly, to semiconductor memory modules on which memory chips are mounted by a flip-chip bonding method and methods of fabricating the same.

BACKGROUND

Generally, a semiconductor memory module may be used for increasing a memory capacity in electronic circuit systems such as a personal computer (PC) and/or a workstation. The semiconductor memory module may include a plurality of semiconductor memory chips mounted on a module board (e.g., a printed circuit board (PCB)).

High density and high performance semiconductor memory modules have been developed with the advance of the electronics industry. However, the capacity of the semiconductor memory module demanded by users has rapidly increased due to rapid spread and development of the internet and computerization of works but there is a limit to techniques expanding the capacity of the semiconductor memory module. Thus, various research has been conducted for semiconductor memory modules capable of satisfying the demands of the users.

SUMMARY

Embodiments of the inventive concept may provide semiconductor memory modules capable of protecting memory chips mounted on a module board by a flip-chip bonding method and satisfying tastes of users.

Embodiments of the inventive concept may provide method of fabricating a semiconductor memory module capable of protecting memory chips mounted on a module board by a flip-chip bonding method and satisfying tastes of users.

In one aspect, a semiconductor memory module may include a module board having a first surface and a second surface opposite to the first surface and memory chips mounted directly on the module board by a flip-chip bonding method. Each of the memory chips may include a passivation layer disposed on a rear surface of each of the memory chips.

In some embodiments, the passivation layer may have a color different from a natural color of single-crystalline silicon. In some another embodiments, the passivation layer may be formed in a wafer process for fabricating the memory chips. In other embodiments, the passivation layer may be formed by a deposition method or a coating method. In still other embodiments, the passivation layer may include an oxide layer or a nitride layer. In even other embodiments, the memory chips may be mounted on the first surface and the second surface of the module board. In yet other embodiments, the semiconductor memory module may further include: mounting members provided between the module board and the memory chips. In yet still other embodiments, the module board may include connector connecting pins provided on at least one of the first surface and the second surface.

In another aspect, a semiconductor memory module may include a module board having a first surface and a second surface opposite to the first surface, a plurality of memory chips mounted on both the first and second surface of the module board, a plurality of solder bumps positioned between the module board and the plurality of memory chips, and a passivation layer disposed on a rear surface of each of the plurality of memory chips.

In some embodiments, the module board may include connector connecting pins provided on at least one of the first surface and the second surface. The module board is electrically connected to a main board of an electronic circuit system through the connector connecting pins. In other embodiments, the side edges of the memory chips may be exposed. In still other embodiments, the rear surface of the memory chip may be polished. The passivation layer may be formed on the polished rear surface of the memory chip.

In still another aspect, a method of fabricating a semiconductor memory module using memory chips having a passivation layer on a rear surface thereof may include preparing a module board having a first surface and a second surface opposite to the first surface and mounting the memory chips directly on the module board by a flip-chip bonding method. The passivation layer may have a color different from a natural color of single-crystalline silicon.

In some embodiments, the method may further include polishing the rear surface of the wafer for reducing a thickness of the memory chip. The passivation layer may be formed on the polished rear surface of the wafer. In even other embodiments, the passivation layer may include an oxide layer or a nitride layer. In yet still other embodiments, the memory chips may be mounted through mounting members between the module board and the memory chips.

BRIEF DESCRIPTION OF THE DRAWINGS

The inventive concept will become more apparent in view of the attached drawings and accompanying detailed description.

DETAILED DESCRIPTION OF ILLUSTRATIVE EMBODIMENTS

Figure 1:
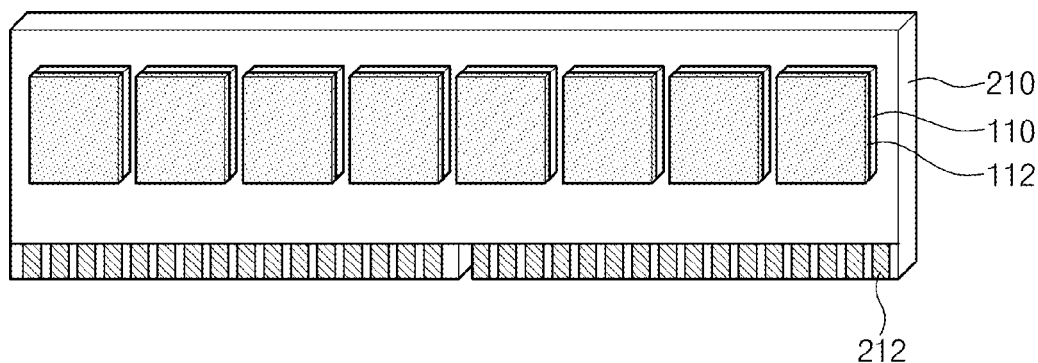
FIG. 1 is an isometric view illustrating a semiconductor memory module according to one embodiment of the inventive concept.

The inventive concept will now be described more fully hereinafter with reference to the accompanying drawings, in which example embodiments of the inventive concept are shown. The advantages and features of the inventive concept and methods of achieving them will be apparent from the following example embodiments that will be described in more detail with reference to the accompanying drawings. It should be noted, however, that the inventive concept is not limited to the following example embodiments, and may be implemented in various forms. Accordingly, the exemplary embodiments are provided only to disclose the inventive concept and let those skilled in the art know the category of the inventive concept. In the drawings, embodiments of the inventive concept are not limited to the specific examples provided herein and are exaggerated for clarity.

The terminology used herein is for the purpose of describing particular embodiments only and is not intended to limit the invention. As used herein, the singular terms "a," "an" and "the" are intended to include the plural forms as well, unless the context clearly indicates otherwise. As used herein, the term "and/or" includes any and all combinations of one or more of the associated listed items. It will be understood that when an element is referred to as being "connected" or "coupled" to another element, it may be directly connected or coupled to the other element or intervening elements may be present.

Similarly, it will be understood that when an element such as a layer, region or substrate is referred to as being "on" another element, it can be directly on the other element or intervening elements may be present. In contrast, the term "directly" means that there are no intervening elements. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Additionally, the embodiment in the detailed description will be described with sectional views as ideal exemplary views of the inventive concept. Accordingly, shapes of the exemplary views may be modified according to manufacturing techniques and/or allowable errors. Therefore, the embodiments of the inventive concept are not limited to the specific shape illustrated in the exemplary views, but may include other shapes that may be created according to manufacturing processes. Areas exemplified in the drawings have general properties, and are used to illustrate specific shapes of elements. Thus, this should not be construed as limited to the scope of the inventive concept.

It will be also understood that although the terms first, second, third etc. may be used herein to describe various elements, these elements should not be limited by these terms. These terms are only used to distinguish one element from another element and not necessarily to imply an order. Thus, a first element in some embodiments could be termed a second element in other embodiments without departing from the teachings of the present invention. Example embodiments of aspects of the present inventive concept explained and illustrated herein include their complementary counterparts. The same reference numerals or the same reference designators denote the same elements throughout the specification.

Moreover, example embodiments are described herein with reference to cross-sectional illustrations and/or plane illustrations that are idealized example illustrations. Accordingly, variations from the shapes of the illustrations as a result, for example, of manufacturing techniques and/or tolerances, are to be expected. Thus, example embodiments should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the figures are schematic in nature and their shapes are not intended to illustrate the actual shape of a region of a device and are not intended to limit the scope of example embodiments.

Figure 2:
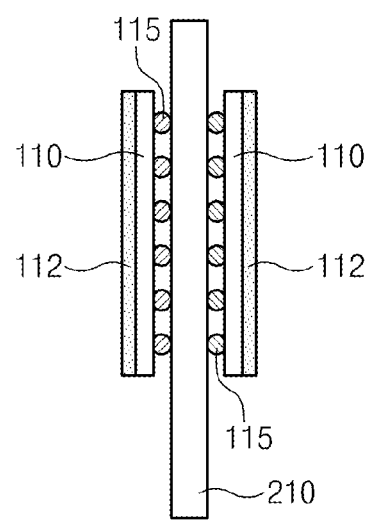
FIG. 2 is a side view illustrating a semiconductor memory module according to one embodiment of the inventive concept.

FIG. 1 is an isometric view illustrating a semiconductor memory module according to one embodiment of the inventive concept, and FIG. 2 is a side view illustrating a semiconductor memory module according to one embodiment of the inventive concept.

Referring to FIGS. 1 and 2, a semiconductor memory module 200 may include a module board 210 and memory chips 110. The module board 210 may be a rigid printed circuit board (PCB) or a flexible PCB. The memory chips 110 may be semiconductor chips.

The module board 210 may include connector connecting pins 212 provided on an edge portion of the module board 210. When the semiconductor memory module 200 is inserted in a connector of a main board of an electronic circuit system such as a personal computer (PC) or a workstation, the semiconductor memory module 200 may be electrically connected to the main board through the connector connecting pins 212.

The memory chips 110 may be mounted directly on a first surface and a second surface opposite to each other of the module board 210 through mounting members 115 by a flip-chip bonding method. The mounting members 115 may be solder bumps. Since the memory chips 110 are mounted directly on the module board 210 by the flip-chip bonding method, a rear surface of the memory chip 110 may be exposed. For protecting the exposed rear surface, a passivation layer 112 may be provided on the rear surface of the memory chip 110. The passivation layer 112 may have a color different from a natural color of single-crystalline silicon. After providing the passivation layer 112, the side edges of the memory chips 110 may be still exposed.

Figure 3:
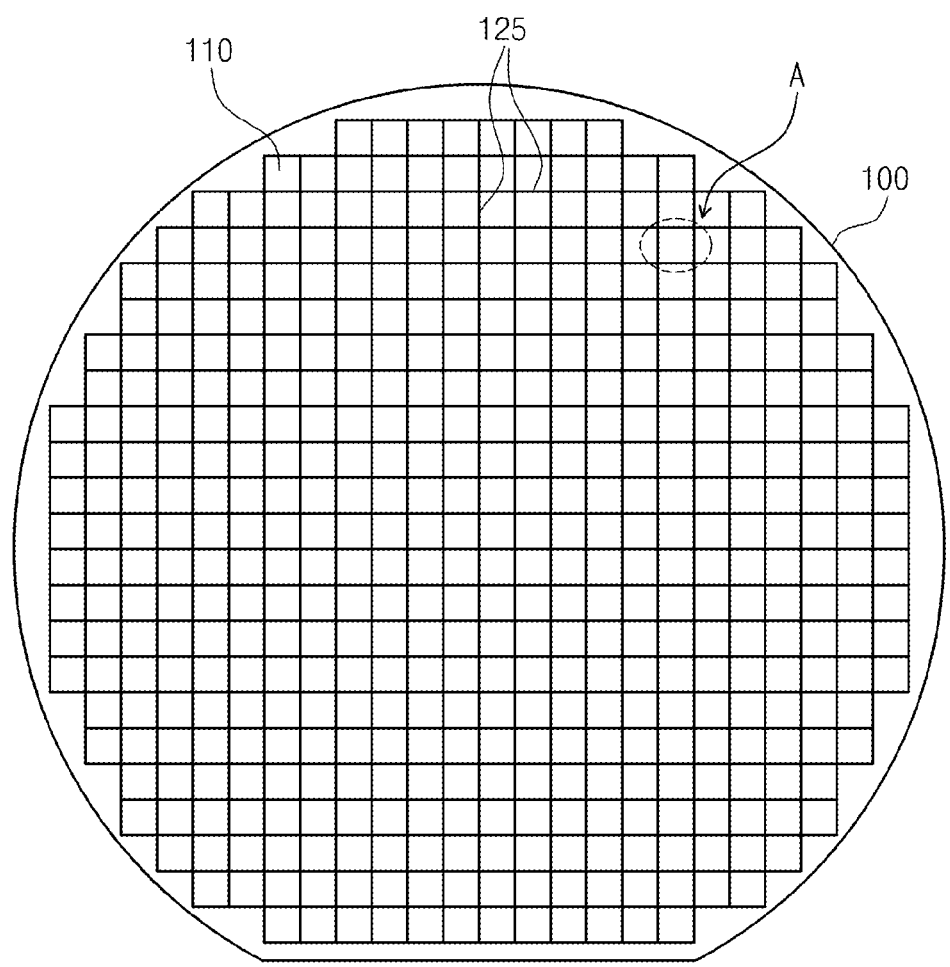
FIG. 3 is a plan view of a semiconductor substrate in which memory chips included in a semiconductor memory module according to one embodiment of the inventive concept are formed.

The passivation layer 112 may be formed in a wafer process for fabricating the memory chip 110 on a semiconductor substrate 100 of FIG. 3. The passivation layer 112 may be formed by a deposition method or a coating method. The passivation layer 112 may be formed of an oxide layer (e.g., a silicon oxide layer) and/or a nitride layer (e.g., a silicon nitride layer).

The semiconductor memory module 200 according to one embodiment includes the passivation layer 112 provided on the rear surface of the memory chip 110, so that it is possible to protect the rear surface of the memory chip 110 mounted directly on the module board 210 by the flip-chip bonding method. Thus, a semiconductor memory module 200 with improved reliability may be realized.

Additionally, the passivation layer 112 on the rear surface of the memory chip 110 may have one of various colors different from the natural color of the single-crystalline silicon. Thus, it is possible to satisfy tastes of the users.

FIG. 3 is a plan view a semiconductor substrate in which memory chips included in a semiconductor memory module according to one embodiment of the inventive concept are formed.

Referring to FIG. 3, a semiconductor substrate 100 is prepared. The semiconductor substrate 100 may be a silicon wafer. Semiconductor chips 110 may be provided on the semiconductor substrate 100 by general fabrication processes. Additionally, scribe lines 125 for separating the semiconductor chips 110 from each other may be provided on the semiconductor substrate 100.

Figure 4:
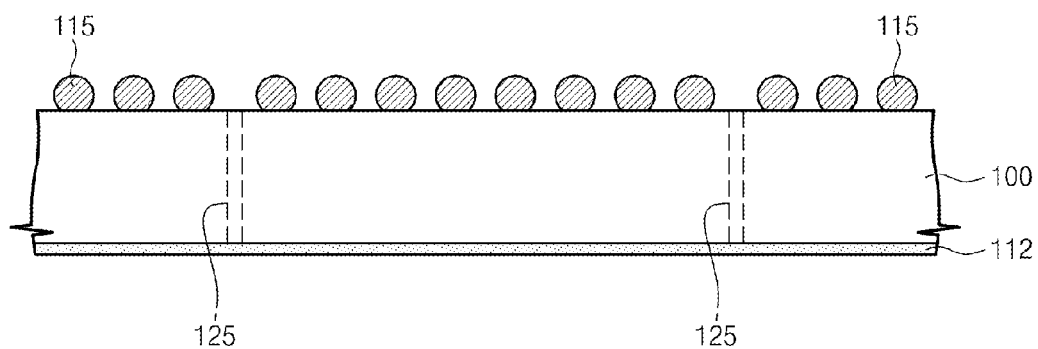
FIGS. 4 to 6 are cross-sectional views illustrating a method of fabricating a memory chip included in a semiconductor memory module according to one embodiment of the inventive concept.
Figure 5:
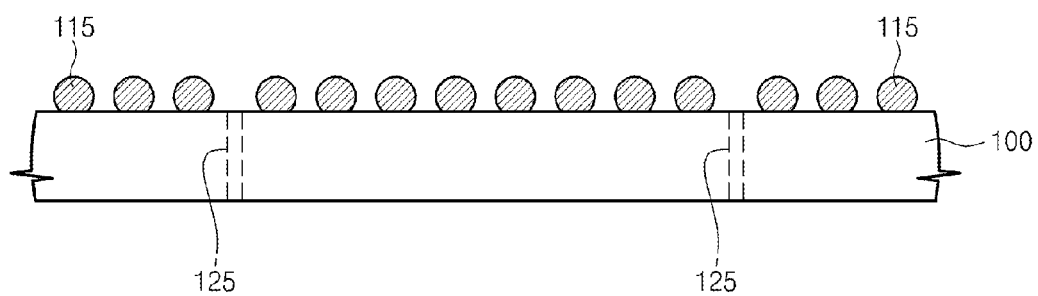
Figure 6:
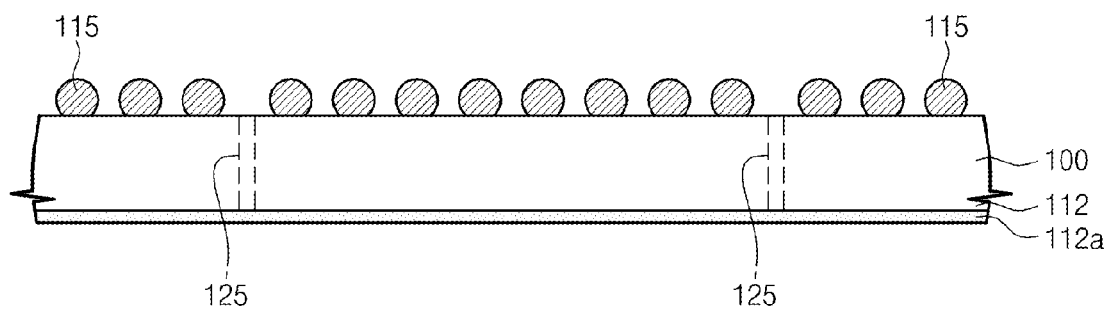

FIGS. 4 to 6 are cross-sectional views illustrating a method of fabricating a memory chip included in a semiconductor memory module according to one embodiment of the inventive concept.

Referring to FIG. 4, mounting members 115 may be formed to be connected to bonding pads (not shown) of the semiconductor chips 110 provided on the semiconductor substrate 100 of FIG. 3. The bonding pads may be disposed on active surfaces of the semiconductor chips 110. The mounting members 115 may be solder bumps.

A passivation layer 112 may be formed on a rear surface opposite to the active surface of the semiconductor substrate 100. The passivation layer 112 may be formed on the rear surface of the semiconductor substrate 100 when the wafer process for fabricating the semiconductor chips 110 is performed on the active surface of the semiconductor substrate 100. The passivation layer 112 may have one of various colors different from the natural color of the single-crystalline silicon. The passivation layer 112 may be formed by the deposition method or the coating method. The passivation layer 112 may be formed of an oxide layer (e.g., a silicon oxide layer) and/or a nitride layer (e.g., a silicon nitride layer).

An adhesive material layer for cutting may be formed on the rear surface of the semiconductor substrate 100 including the passivation layer 112. The semiconductor substrate 100 may be cut along the scribe lines 125 by a substrate cutting apparatus, so that the semiconductor chips 110 of FIG. 3 may be divided from each other.

The adhesive material layer for cutting may be a re-workable adhesive which can be easily separated from the semiconductor chips 110 after adhesion. This is because the adhesive material layer for cutting is removed after the semiconductor substrate 100 is divided into the semiconductor chips 110. The adhesive material layer for cutting may be an adhesive including an ultraviolet curable resin (UV resin) or a thermoplastic resin.

Referring to FIG. 5, a handling wafer (not shown) may be bonded to the active surface of the semiconductor substrate 100 including the passivation layer 112 of FIG. 4 on the rear surface thereof, differently from the method described with reference to FIG. 4. The handling wafer may be bonded to the semiconductor substrate 100 by an adhesive material layer for the semiconductor substrate 100. The handling wafer may be used for decreasing a physical stress applied to the semiconductor substrate 100 in a process of polishing the rear surface of the semiconductor substrate 100 and for suppressing warpage of a thinned semiconductor substrate 100 after the polishing process is performed.

The handling wafer may be a substrate formed of a material having a coefficient of thermal expansion (CTE) equal to or similar to that of the semiconductor substrate 100. For example, the handling wafer may be a silicon substrate or a glass substrate. Additionally, the handling wafer may have the same circular plate-shape as the semiconductor substrate 100.

The adhesive material layer for the semiconductor substrate may be a re-workable adhesive which can be easily separated from the semiconductor substrate 100 after adhesion. This is because the adhesive material layer for the semiconductor substrate is removed after the rear surface of the semiconductor substrate 100 is polished. The adhesive material layer for the semiconductor substrate may be an adhesive including an ultraviolet curable resin (UV resin) or a thermoplastic resin.

Polishing the rear surface of the semiconductor substrate 100 may be performed for thinning the semiconductor chip. The passivation layer 112 formed in the wafer process for fabricating the semiconductor chips may be removed by the polishing process of the rear surface of the semiconductor substrate 100.

Referring to FIG. 6, an additional passivation layer 112a may be formed on the rear surface of the semiconductor substrate 100 where the passivation layer 112 of FIG. 4 is removed by the rear surface polishing process. The additional passivation layer 112a may have one of various colors different from the natural color of the single-crystalline silicon. The additional passivation layer 112a may be formed of a deposition method or a coating method. The additional passivation layer 112a may be formed of an oxide layer (e.g., a silicon oxide layer) or a nitride layer (e.g., a silicon nitride layer).

The adhesive material layer for cutting may be formed on the rear surface of the semiconductor substrate 100 including the additional passivation layer 112a. The semiconductor substrate 100 may be cut along the scribe lines 125 by the substrate cutting apparatus, such that the semiconductor substrate 100 may be divided into the semiconductor chips 110 of FIG. 3.

The adhesive material layer for cutting may be a re-workable adhesive which can be easily separated from the semiconductor chips 110 after adhesion. This is because the adhesive material layer for cutting is removed after the semiconductor substrate 100 is divided into the semiconductor chips 110. The adhesive material layer for cutting may be an adhesive including an ultraviolet curable resin (UV resin) or a thermoplastic resin.

Referring to FIG. 1 again, the memory chips 110 including the passivation layer 112 provided to the rear surface thereof may be mounted directly on the first surface and the second surface opposite to each other of the module board 210 through the mounting members 115 by a flip-chip bonding method. Thus, the semiconductor memory module may be fabricated.

The semiconductor memory module 200 according to one embodiment includes the passivation layer 112 provided on the rear surface of the memory chip 110, so that it is possible to protect the rear surface of the memory chip 110 mounted directly on the module board 210 by the flip-chip bonding method. Thus, a semiconductor memory module 200 with improved reliability may be realized.

Additionally, the passivation layer 112 on the rear surface of the memory chip 110 may have one of various colors different from the natural color of the single-crystalline silicon. Thus, it is possible to satisfy tastes of the users.

Figure 7:
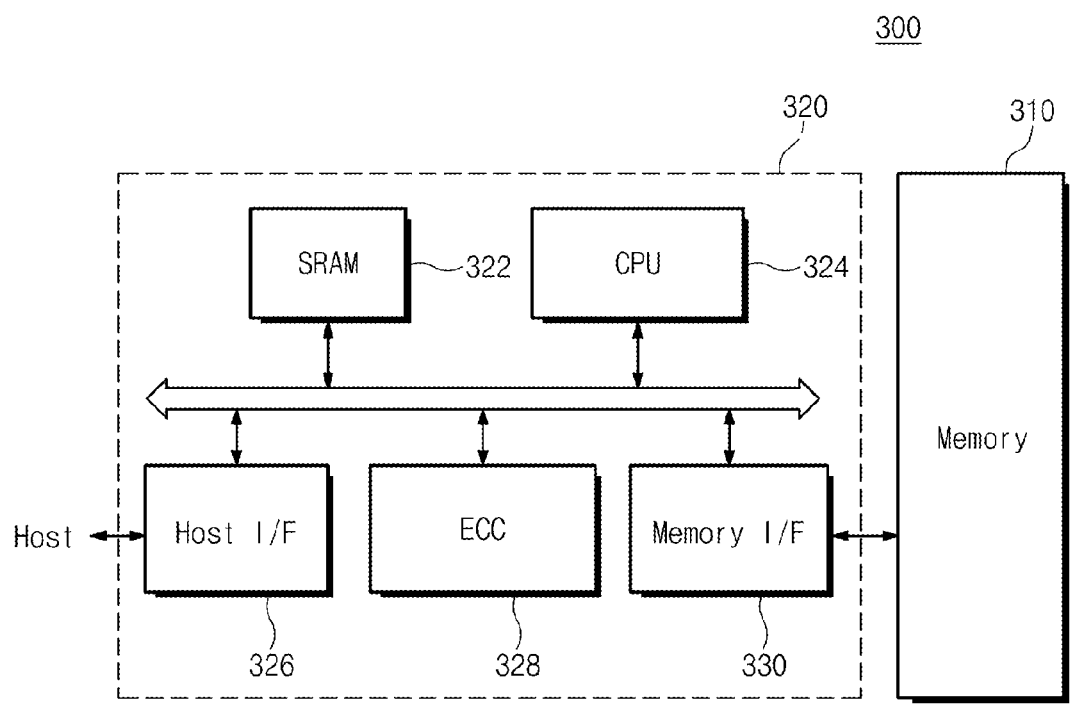
FIG. 7 is a block diagram illustrating an example of a memory card including semiconductor memory modules according to one embodiment of the inventive concept.

FIG. 7 is a block diagram illustrating an example of a memory card including semiconductor memory modules according to one embodiment of the inventive concept.

Referring to FIG. 7, the semiconductor memory module according to embodiments of the inventive concept may be applied to a memory card 300. For example, the memory card 300 may include a memory controller 320 that controls data exchange between a host and a memory 310. A SRAM 322 may be used as an operation memory of a central processing unit (CPU) 324. A host interface 326 may be configured to include a data communication protocol between the memory card 300 and the host. An error check and correction (ECC) block 328 may detect and correct errors of data which are read out from the memory 310. A memory interface 330 may connect the memory controller 320 to the memory 310. The CPU 324 that controls overall operations of the memory controller 320.

The memory 310 in the memory card 300 may include the semiconductor memory module according to embodiments of the inventive concept. Thus, it is possible to improve reliability of the memory card 310.

Figure 8:
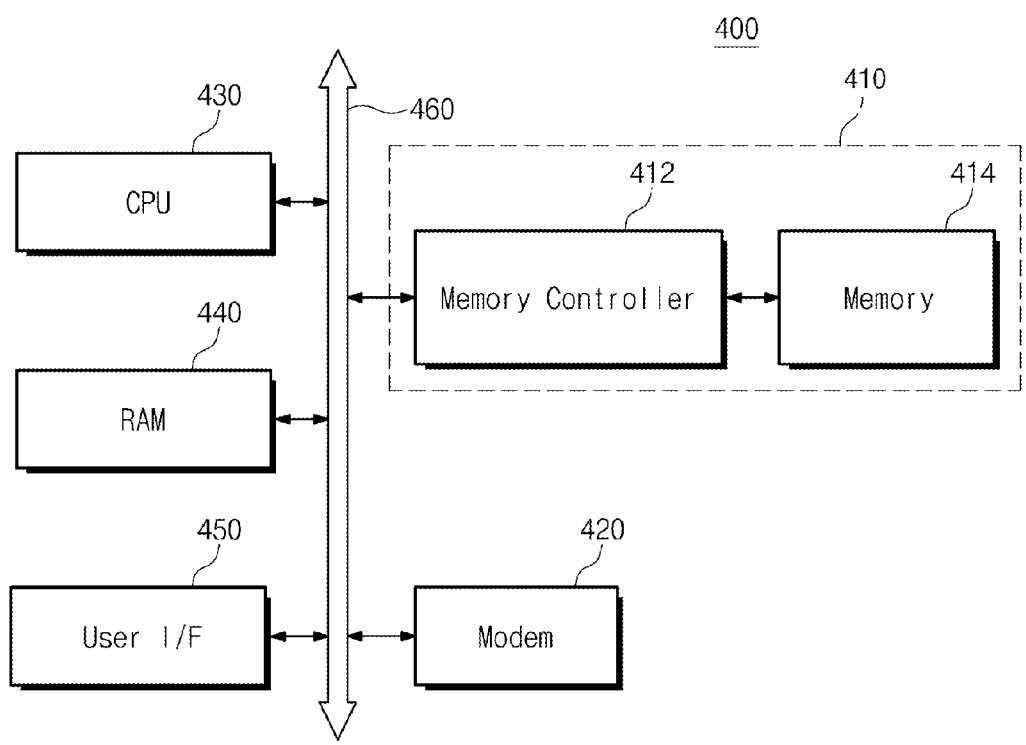
FIG. 8 is a block diagram illustrating an example of an information processing systems including semiconductor memory modules according to one embodiment of the inventive concept.

FIG. 8 is a block diagram illustrating an example of an information processing system including semiconductor memory modules according to one embodiment of the inventive concept.

Referring to FIG. 8, an information processing system 400 may include a memory system 410 including the semiconductor memory module according to embodiments of the inventive concept. The information processing system 400 may include a mobile device or a computer. For example, the information processing system 400 may include a modem 420, a central processing unit (CPU) 430, a random access memory (RAM) 440, and a user interface unit 450 that are electrically connected to the memory system 410 through a system bus 460. The memory system 410 may store data processed by the central processing unit 430 or data inputted from an external device. The memory system 410 may include a memory device 412 and a memory controller 414. The memory system 410 may be substantially the same as the memory card 300 described with reference to FIG. 7. The information processing system 400 may be realized as a memory card, a solid state disk (SSD) device, a camera image sensor or another type of application chipset. For example, the memory system 410 may consist of the SSD device. In this case, the information processing system 400 may stably and reliably store massive data.

As described above, according to one embodiment of the inventive concept, a passivation layer is provided on a rear surface of a memory chip mounted directly on a module board by a flip-chip bonding method, such that the rear surface of the memory chip may be protected. Thus, a semiconductor memory module with improved reliability may be realized.

Additionally, the passivation layer on the rear surface of the memory chip may have one of various colors different from the natural color of the single-crystalline silicon. In other words, the semiconductor memory module may have a distinct color. Thus, it is possible to satisfy tastes of the users.

While the inventive concept has been described with reference to example embodiments, it will be apparent to those skilled in the art that various changes and modifications may be made without departing from the spirit and scope of the inventive concept. Therefore, it should be understood that the above embodiments are not limiting, but illustrative. Thus, the scope of the inventive concept is to be determined by the broadest permissible interpretation of the following claims and their equivalents, and shall not be restricted or limited by the foregoing description.

What is claimed is:

1. A semiconductor memory module comprising:
   a module board having a first surface and a second surface opposite to the first surface;
   memory chips mounted directly on the module board by a flip-chip bonding method; and
   a passivation layer disposed on a rear surface of each of the memory chips,
   wherein the passivation layer has a color different from a natural color of single-crystalline silicon, and
   wherein side edges of the memory chips are exposed.

2. The semiconductor memory module of claim 1, wherein the module board includes connector connecting pins provided on at least one of the first surface and the second surface.

3. The semiconductor memory module of claim 2, wherein the module board is electrically connected to a main board of an electronic circuit system through the connector connecting pins.

4. The semiconductor memory module of claim 1, wherein the passivation layer is formed in a wafer process for fabricating the memory chip.

5. The semiconductor memory module of claim 1, wherein the passivation layer is formed by a deposition method or a coating method.

6. The semiconductor memory module of claim 1, wherein the passivation layer comprises an oxide layer or a nitride layer.

7. The semiconductor memory module of claim 1, wherein the memory chips are mounted on the first surface and the second surface of the module board.

8. The semiconductor memory module of claim 1, further comprising:
   mounting members provided between the module board and the memory chips.

9. A semiconductor memory module comprising:
   a module board having a first surface and a second surface opposite to the first surface;
   a plurality of memory chips mounted on both the first and second surface of the module board;
   a plurality of solder bumps positioned between the module board and the plurality of memory chips; and
   a passivation layer disposed on a rear surface of each of the plurality of memory chips, wherein side edges of the memory chips are exposed.

10. The semiconductor memory module of claim 9, wherein the module board includes connector connecting pins provided on at least one of the first surface and the second surface.

11. The semiconductor memory module of claim 10, wherein the module board is electrically connected to a main board of an electronic circuit system through the connector connecting pins.

12. The semiconductor memory module of claim 9, wherein the rear surface of the memory chip is polished.

13. The semiconductor memory module of claim 12, wherein the passivation layer is formed on the polished rear surface of the memory chip.

14. The semiconductor memory module of claim 9, wherein the passivation layer is an oxide layer or a nitride layer.

* * * * *